US012777623B2

(12) United States Patent
Matsumoto

(10) Patent No.: US 12,777,623 B2
(45) Date of Patent: Oct. 27, 2026

(54) ELECTRIC POWER CONVERSION APPARATUS

(71) Applicant: TMEIC CORPORATION, Tokyo (JP)

(72) Inventor: Kei Matsumoto, Tokyo (JP)

(73) Assignee: TMEIC Corporation, Tokyo (JP)

( * ) Notice: Subject to any disclaimer, the term of this patent is extended or adjusted under 35 U.S.C. 154(b) by 0 days.

(21) Appl. No.: 18/250,564

(22) PCT Filed: Oct. 8, 2021

(86) PCT No.: PCT/JP2021/037374
§ 371 (c)(1),
(2) Date: Apr. 26, 2023

(87) PCT Pub. No.: WO2023/058231
PCT Pub. Date: Apr. 13, 2023

(65) Prior Publication Data

US 2023/0389240 A1 Nov. 30, 2023

(51) Int. Cl.
*H05K 7/20* (2006.01)
*H02M 7/00* (2006.01)

(52) U.S. Cl.
CPC ............ *H05K 7/209* (2013.01); *H02M 7/003* (2013.01)

(58) Field of Classification Search
None
See application file for complete search history.

(56) References Cited

U.S. PATENT DOCUMENTS 5,504,655 A 4/1996 Underwood et al.
6,984,965 B2 1/2006 Vinciarelli
9,042,112 B2 * 5/2015 Guan ................ H05K 7/14329 361/709
11,758,698 B2 * 9/2023 Lee ...................... H05K 5/0217 361/715
11,916,491 B2 * 2/2024 Miyamoto ........ H02M 7/53871
12,021,444 B2 * 6/2024 Li ........................... H02M 1/32
12,143,026 B2 * 11/2024 Nakata ............... H05K 7/20445
2004/0062006 A1 * 4/2004 Pfeifer ............... H05K 7/20927 257/E23.098
2020/0195189 A1 * 6/2020 Kitamura ................ B60L 50/51
2020/0350830 A1 * 11/2020 Hano .................... H02M 7/537

FOREIGN PATENT DOCUMENTS

JP 8-126349 A 5/1996
JP 2019-221048 A 12/2019
JP 2020-167808 A 10/2020
WO WO 2019/189450 A1 10/2019

OTHER PUBLICATIONS

International Search Report mailed on Nov. 22, 2021 in PCT/JP2021/037374 filed on Oct. 8, 2021, 4 pages.
Indian Office Action issued Feb. 3, 2026 in Indian Patent Application No. 202317030179, 6 pages.

* cited by examiner

*Primary Examiner* — Courtney L Smith
(74) *Attorney, Agent, or Firm* — Knobbe, Martens, Olson & Bear, LLP

(57) ABSTRACT

An electric power conversion apparatus of an embodiment includes a DC-side terminal and a heat release member. The heat release member is electrically conductive. The heat release member is provided on the DC-side terminal.

1 Claim, 4 Drawing Sheets

ELECTRIC POWER CONVERSION APPARATUS

TECHNICAL FIELD

An embodiment of the present invention relates to an electric power conversion apparatus.

BACKGROUND

In the related art, an electric power control apparatus in which a heat release fin is provided on a housing which accommodates an electronic device is known. The electric power conversion apparatus includes, for example, a heat sink on a heat release substrate on which a plurality of switching elements that are heat sources are mounted and thereby cools the plurality of switching elements.

However, in the electric power conversion apparatus, since heat generation occurs in accordance with a heat transfer or an electric power distribution amount even in a path for electric power distribution such as a metal conductor or an electric wire connected to the plurality of switching elements, there is a possibility that an abnormality caused by a temperature increase may occur.

RELATED ART DOCUMENTS

Patent Documents

[Patent Document 1]

Japanese Unexamined Patent Application, First Publication No. 2020-167808

SUMMARY OF INVENTION

Problems to be Solved by the Invention

A problem to be solved by the present invention is to provide an electric power conversion apparatus capable of improving a heat release capability.

Means for Solving the Problem

An electric power conversion apparatus of an embodiment includes a DC-side terminal and a heat release member. The heat release member is electrically conductive. The heat release member is provided on the DC-side terminal.

DESCRIPTION OF THE EMBODIMENTS

Hereinafter, an electric power conversion apparatus according to an embodiment will be described with reference to the drawings.

Figure 1:
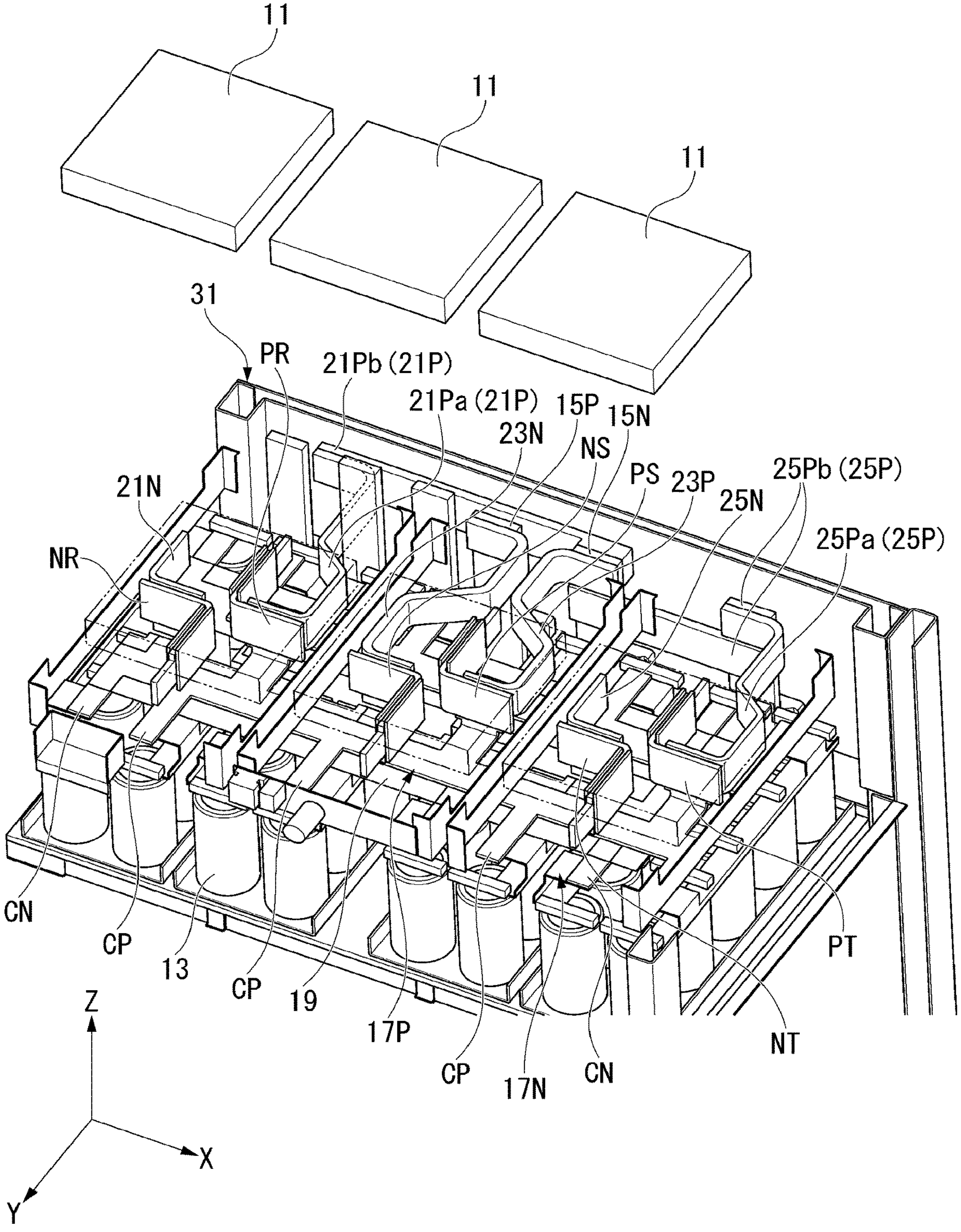
FIG. 1 is an exploded perspective view showing a configuration of an electric power conversion apparatus according to an embodiment.
Figure 2:
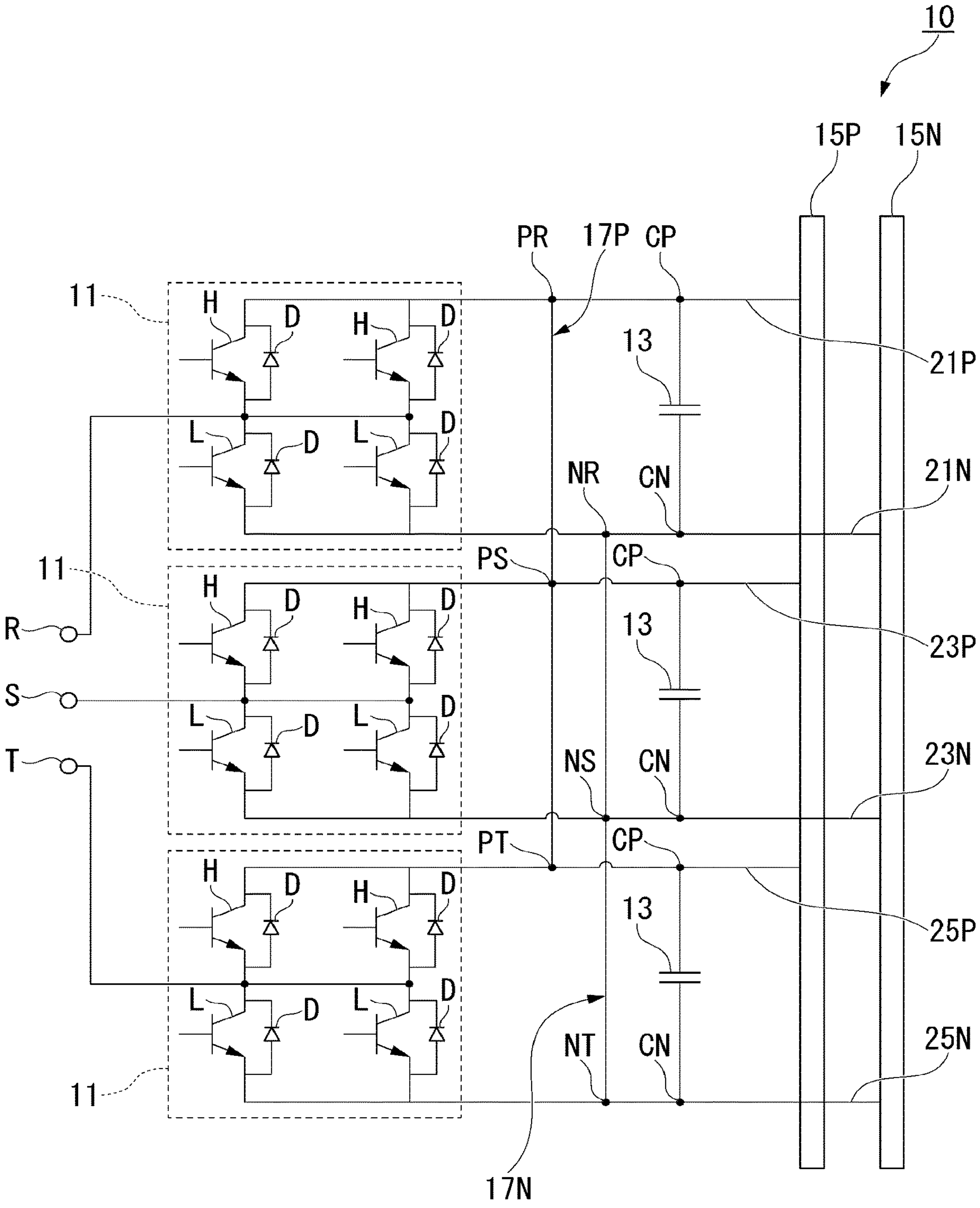
FIG. 2 is a view showing a configuration of the electric power conversion apparatus according to the embodiment.

FIG. 1 is an exploded perspective view showing a configuration of an electric power conversion apparatus 10 according to an embodiment. FIG. 2 is a view showing a configuration of the electric power conversion apparatus 10 according to the embodiment.

Hereinafter, each axis direction of the X-axis, the Y-axis, and the Z-axis orthogonal to one another in a three-dimensional space is in a direction parallel to each axis. For example, as shown in FIG. 1, the Z-axis direction is parallel to a thickness direction of the electric power conversion apparatus 10. The Y-axis direction is parallel to a shorter direction of the electric power conversion apparatus 10. The X-axis direction is parallel to a longer direction of the electric power conversion apparatus 10.

The electric power conversion apparatus 10 is, for example, a board provided on an electrical facility or the like. The board is a switchboard, a distribution board, a control board, and the like that constitute an electric power supply apparatus, a motor drive apparatus, and the like.

The electric power conversion apparatus 10 includes, for example, a variety of circuit components such as a semiconductor element, a conductor, a fuse, a capacitor, a transformer, a switch, a circuit breaker, and a measurement device that constitute an electric power converter such as an inverter.

As shown in FIG. 1, the electric power conversion apparatus 10 includes, for example, multiple-phase semiconductor stacks 11, a plurality of condensers (capacitors) 13, a positive-electrode bus bar 15P, a negative-electrode bus bar 15N, a positive-electrode-side connection member 17P, a negative-electrode-side connection member 17N, an insulation member 19, multiple-phase positive-electrode heat release members (21P, 23P, and 25P) of each phase, and multiple-phase negative-electrode heat release members (21N, 23N, and 25N) of each phase.

The multiple-phase semiconductor stacks 11 are, for example, three-phase semiconductor stacks 11 of an R-phase, S-phase, and a T-phase. The three-phase semiconductor stacks 11 are arranged, for example, on a first end part among both end parts in a thickness direction of the electric power conversion apparatus 10. The first end part is, for example, an end part on a positive direction side of the Z-axis direction. The three-phase semiconductor stacks 11 are arranged, for example, to be aligned on a line along the X-axis direction.

As shown in FIG. 2, each semiconductor stack 11 includes, for example, a bridge circuit formed of a plurality of switching elements and a rectifier element that are connected by a bridge connection. The switching element is a transistor such as an IGBT (Insulated-Gate Bipolar Transistor) or a MOSFET (Metal-Oxide-Semiconductor Field-Effect Transistor). The rectifier element is a diode connected in parallel to each transistor.

The bridge circuit includes a plurality of pairs of high-side-arm and low-side-arm transistors H and L. The bridge circuit includes a reflux diode D that is connected in a forward direction from an emitter toward a collector between the collector and the emitter of each transistor H and L.

A collector of the high-side-arm transistor H of each phase is connected to a positive terminal PR, PS, and PT of each phase. An emitter of the low-side-arm transistor L of each phase is connected to a negative terminal NR, NS, and NT of each phase. An emitter of the high-side-arm transistor H of each phase and a collector of the low-side-arm transistor L of each phase are connected to an AC-side terminal R, S, and T of each phase.

As shown in FIG. 1, the plurality of capacitors 13 are arranged, for example, on a second end part of both end parts in the thickness direction of the electric power conversion apparatus 10. The second end part is, for example, an end part on a negative direction side of the Z-axis direction. The plurality of capacitors 13 are arranged, for example, to be aligned on a plurality of lines along each of the X-axis direction and the Y-axis direction.

As shown in FIG. 2, the plurality of capacitors 13 are connected in parallel to the three-phase semiconductor stack 11 of each phase. Each capacitor 13 is, for example, a capacitor that smooths a voltage variation that occurs in accordance with an on-off switching operation of each switching element of the semiconductor stack 11. The capacitor 13 of each phase is connected to and between a positive-electrode-side terminal CP of each phase and a negative-electrode-side terminal CN of each phase.

The positive-electrode bus bar 15P is a conductor connected commonly to multiple-phase positive-electrode terminals PR, PS, and PT of each phase. The negative-electrode bus bar 15N is a conductor connected commonly to the multiple-phase negative-electrode terminals NR, NS, and NT of each phase.

As shown in FIG. 1, outer shapes of the positive-electrode bus bar 15P and the negative-electrode bus bar 15N are, for example, a rectangular plate shape. The positive-electrode bus bar 15P and the negative-electrode bus bar 15N are arranged, for example, at a middle part in the X-axis direction and at one end part in the Y-axis direction of the electric power conversion apparatus 10. The positive-electrode bus bar 15P and the negative-electrode bus bar 15N are aligned so as to be adjacent to each other in the X-axis direction and are arranged in parallel with each other in the Z-axis direction.

The positive-electrode-side connection member 17P and the negative-electrode-side connection member 17N are, for example, a conductor having a plate shape. The positive-electrode-side connection member 17P and the negative-electrode-side connection member 17N are arranged, for example, to be laminated in the Z-axis direction with each other between the multiple-phase semiconductor stack 11 and the plurality of capacitors 13.

As shown in FIG. 2, the positive-electrode-side connection member 17P connects a multiple-phase positive-electrode terminal PR, PS, and PT to the positive-electrode-side terminal CP of the multiple-phase capacitor 13.

The negative-electrode-side connection member 17N connects a multiple-phase negative terminal NR, NS, and NT to the negative-electrode-side terminal CN of the multiple-phase capacitor 13.

The positive-electrode-side connection member 17P and the negative-electrode-side connection member 17N connect the multiple-phase capacitors 13 in parallel.

As shown in FIG. 1, the outer shape of the insulation member 19 is, for example, a sheet shape. The insulation member 19 is arranged between, for example, the positive-electrode-side connection member 17P and the negative-electrode-side connection member 17N that are laminated in the Z-axis direction. The insulation member 19 electrically insulates the positive-electrode-side connection member 17P and the negative-electrode-side connection member 17N from each other.

The outer shape of each of the multiple-phase positive-electrode heat release member and the multiple-phase negative-electrode heat release member is, for example, a plate shape. Each positive-electrode heat release member and each negative-electrode heat release member is arranged, for example, so as to protrude in the Z-axis direction from the positive-electrode-side connection member 17P and the negative-electrode-side connection member 17N. Each positive-electrode heat release member and each negative-electrode heat release member is formed of, for example, a material having an electrical conductivity and a thermal conductivity such as a metal.

The multiple-phase positive-electrode heat release members of each phase are, for example, an R-phase positive-electrode heat release member 21P, an S-phase positive-electrode heat release member 21P, and a T-phase positive-electrode heat release member 21P.

The multiple-phase negative-electrode heat release members of each phase are, for example, an R-phase negative-electrode heat release member 21N, an S-phase negative-electrode heat release member 23N, and a T-phase negative-electrode heat release member 25N.

The positive-electrode heat release member 21P, 23P, and 25P of each phase and the negative-electrode heat release member 21N, 23N, and 25N of each phase are connected, for example, to the positive terminal PR, PS, and PT of each phase and the negative terminal NR, NS, and NT of each phase at a middle part in the Y-axis direction of the electric power conversion apparatus 10. The positive-electrode heat release member 21P, 23P, and 25P of each phase and the negative-electrode heat release member 21N, 23N, and 25N of each phase extend, for example, from the middle part in the Y-axis direction of the electric power conversion apparatus 10 toward one end part and are connected to the positive-electrode bus bar 15P and the negative-electrode bus bar 15N.

For example, the R-phase positive-electrode heat release member 21P includes a first positive-electrode heat release member 21Pa and a second positive-electrode heat release member 21Pb. The R-phase negative-electrode heat release member 21N includes a first negative-electrode heat release member (not shown) and a second negative-electrode heat release member (not shown). Each of the R-phase first positive-electrode heat release member 21Pa and the R-phase first negative-electrode heat release member extends from the middle part in the Y-axis direction of the electric power conversion apparatus 10 toward one end part. Each of the R-phase second positive-electrode heat release member 21Pb and the R-phase second negative-electrode heat release member extends from a first end part of both end parts in the X-axis direction toward the middle part along an inner wall surface of a housing 31.

For example, the T-phase positive-electrode heat release member 25P includes a first positive-electrode heat release member 25Pa and a second positive-electrode heat release member 25Pb. The T-phase negative-electrode heat release member 25N includes a first negative electrode heat release member (not shown) and a second negative-electrode heat release member (not shown). Each of the T-phase first positive-electrode heat release member 25Pa and the T-phase first negative-electrode heat release member extends from the middle part in the Y-axis direction of the electric power conversion apparatus 10 toward one end part. Each of the T-phase second positive-electrode heat release member 25Pb and the T-phase second negative-electrode heat release member extends from a second end part of both end parts in the X-axis direction toward the middle part along the inner wall surface of the housing 31.

According to the embodiment described above, by including each positive-electrode heat release member 21P, 23P, and 25P and each negative-electrode heat release member 21N, 23N, and 25N that are provided on each positive terminal PR, PS, and PT and each negative terminal NR, NS, and NT which are DC-side terminals of each phase of the three phases, it is possible to improve the heat release capability. Each heat release member 21P, 23P, 25P, 21N, 23N, and 25N is connected via each terminal PR, PS, PT, NR, NS, and NT to each semiconductor stack 11 which is a heat source and can thereby prompt the heat release of the heat source and prevent a temperature increase of the electric power distribution path.

Each positive-electrode heat release member 21P, 23P, and 25P and each negative-electrode heat release member 21N, 23N, and 25N is connected to the positive-electrode bus bar 15P and the negative-electrode bus bar 15N, and thereby, it is possible to promote the heat transfer to each of the positive-electrode bus bar 15P and the negative-electrode bus bar 15N from the semiconductor stack 11 of each phase. By connecting the semiconductor stack 11 of each phase via no other phases directly to the positive-electrode bus bar 15P and the negative-electrode bus bar 15N, it is possible to improve the heat release of the semiconductor stack 11 of each phase, and it is possible to prevent a local temperature increase of the electric power distribution path.

By including the positive-electrode-side connection member 17P and the negative-electrode-side connection member 17N that connect the multiple-phase capacitors 13 in parallel, it is possible to easily ensure a voltage balance property among the multiple-phases capacitors.

By including the R-phase second positive-electrode heat release member 21Pb, the R-phase second negative-electrode heat release member, the T-phase second positive-electrode heat release member 25Pb, and the T-phase second negative-electrode heat release member that are arranged along the inner wall surface of the housing 31, it is possible to improve the heat release of the R-phase and T-phase semiconductor stacks 11.

When the electric power conversion apparatus 10 is used in a reactive power compensation apparatus, the positive-electrode bus bar 15P and the negative-electrode bus bar 15N can function as a heat release member in which no current flows, and it is possible to increase the device capacity.

Hereinafter, a modification example is described.

The above embodiment is described using an example in which the electric power conversion apparatus 10 includes the positive-electrode heat release member 21P, 23P, and 25P of each phase and the negative-electrode heat release member 21N, 23N, and 25N of each phase that are connected to the positive-electrode bus bar 15P and the negative-electrode bus bar 15N; however, the embodiment is not limited thereto. For example, at least one of the positive-electrode heat release members 21P, 23P, and 25P of the three phases and at least one of the negative-electrode heat release members 21N, 23N, and 25N of the three phases may be connected to the positive-electrode bus bar 15P and the negative-electrode bus bar 15N.

Figure 3:
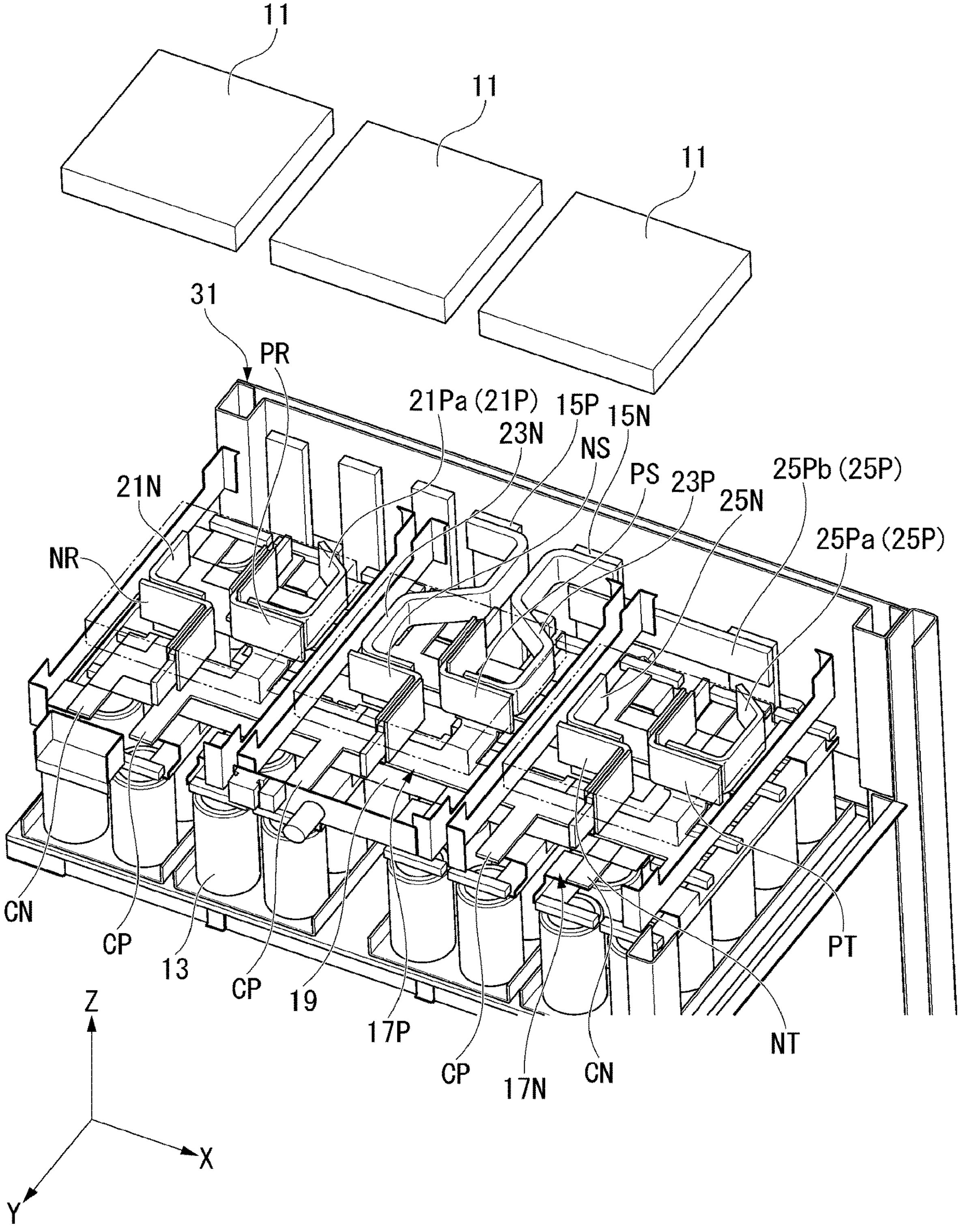
FIG. 3 is an exploded perspective view showing a configuration of an electric power conversion apparatus in a modified example of the embodiment.
Figure 4:
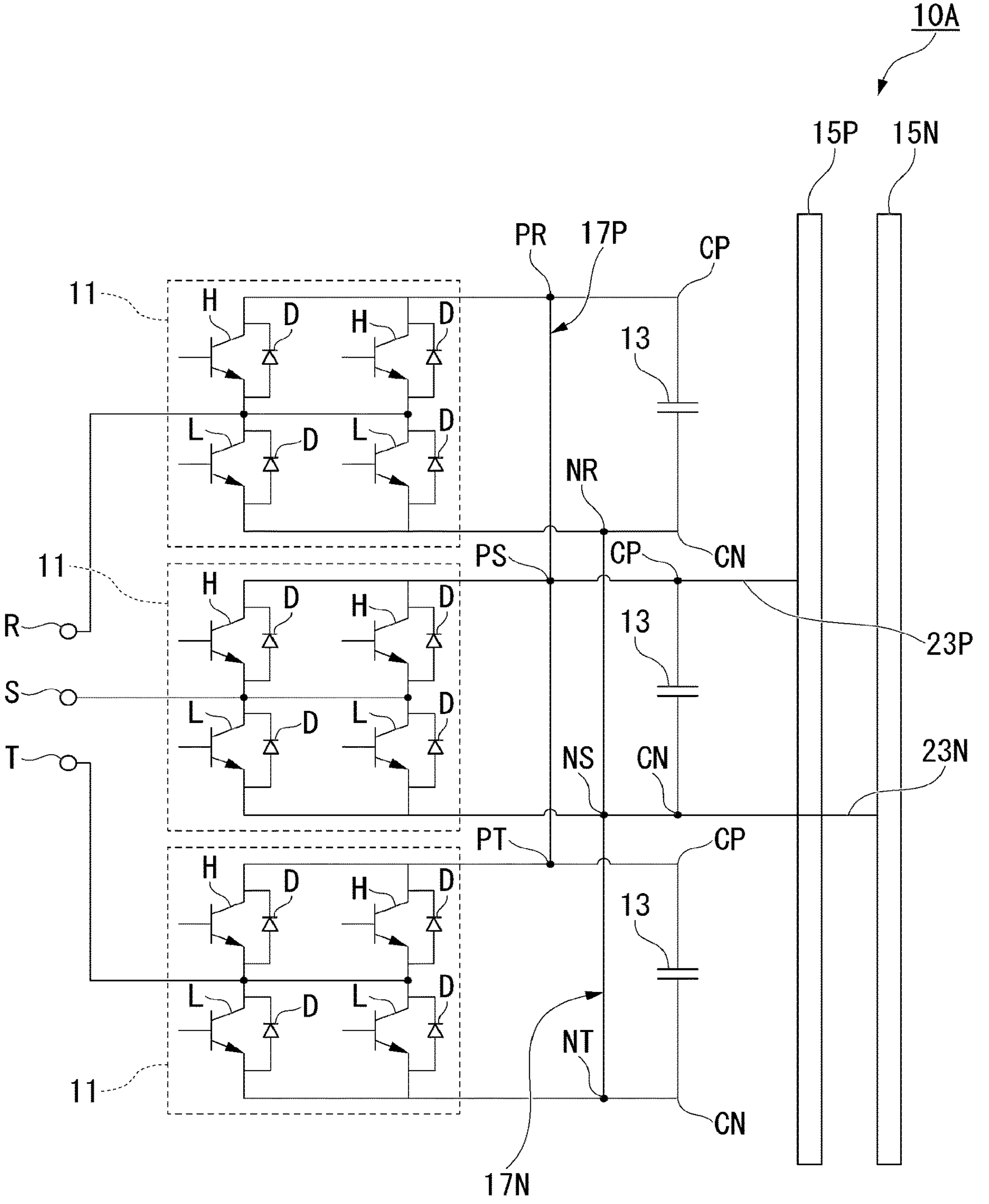
FIG. 4 is a view showing a configuration of the electric power conversion apparatus in the modified example of the embodiment.

FIG. 3 is an exploded perspective view showing a configuration of an electric power conversion apparatus 10A in a modified example of the embodiment. FIG. 4 is a view showing a configuration of the electric power conversion apparatus 10A in the modified example of the embodiment.

As shown in FIG. 3 and FIG. 4, in the electric power conversion apparatus 10A of the modified example, only an S-phase positive-electrode heat release member 23P among the three-phase positive-electrode heat release members 21P, 23P, and 25P is directly connected to the positive-electrode bus bar 15P. Only an S-phase negative-electrode heat release member 23N among the three-phase negative-electrode heat release members 21N, 23N, and 25N is directly connected to the negative-electrode bus bar 15N.

In the electric power conversion apparatus 10A of the modified example, the R-phase and T-phase positive terminals PR and PT are connected indirectly to the positive-electrode bus bar 15P via the positive-electrode-side connection member 17P and the S-phase positive-electrode heat release member 23P. The R-phase and T-phase negative terminals NR and NT are connected indirectly to the negative-electrode bus bar 15N via the negative-electrode-side connection member 17N and the S-phase negative-electrode heat release member 23N.

The above embodiment is described using an example in which the positive-electrode bus bar 15P and the negative-electrode bus bar 15N are arranged at the middle part in the X-axis direction at one end part in the Y-axis direction of the electric power conversion apparatus 10; however, the embodiment is not limited thereto. The positive-electrode bus bar 15P and the negative-electrode bus bar 15N may be arranged at a suitable position in the electric power conversion apparatus 10.

According to at least one embodiment described above, by including each positive-electrode heat release member 21P, 23P, and 25P and each negative-electrode heat release member 21N, 23N, and 25N that are provided on each positive terminal PR, PS, and PT and each negative terminal NR, NS, and NT which are DC-side terminals of each phase of the three phases, it is possible to improve the heat release capability. Each heat release member 21P, 23P, 25P, 21N, 23N, and 25N is connected via each terminal PR, PS, PT, NR, NS, and NT to each semiconductor stack 11 which is a heat source and can thereby prompt the heat release of the heat source and prevent a temperature increase of the electric power distribution path.

Although some embodiments of the present invention have been described, these embodiments are presented as an example and do not limit the scope of the invention. These embodiments can be implemented in various other forms, and a variety of omissions, substitutions, and modifications can be made without departing from the scope of the invention. These embodiments and variations thereof are included in the scope and gist of the invention and are also included in the scope of the invention described in the appended claims and equivalence thereof.

DESCRIPTION OF THE REFERENCE SYMBOLS

10, 10A Electric power conversion apparatus
11 Semiconductor stack
13 Condenser (capacitor)
15N Negative-electrode bus bar
15P Positive-electrode bus bar
17N Negative-electrode-side connection member
17P Positive-electrode-side connection member
19 Insulation member
21N, 23N, 25N Negative-electrode heat release member
21P, 23P, 25P Positive-electrode heat release member
31 Housing
CP Positive-electrode-side terminal
CN Negative-electrode-side terminal
NR, NS, NT Negative-electrode terminal
PR, PS, PT Positive-electrode terminal

The invention claimed is:

1. An electric power conversion apparatus comprising:
a plurality of positive-electrode terminals;
a plurality of negative-electrode terminals;

a positive-electrode common conductor as a common conductor with respect to the plurality of positive-electrode terminals;

a negative-electrode common conductor as a common conductor with respect to the plurality of negative-electrode terminals;

a plurality of positive-electrode heat release members each separately connecting the positive-electrode common conductor to each of the positive-electrode terminals;

a plurality of negative-electrode heat release members each separately connecting the negative-electrode common conductor to each of the negative-electrode terminals;

a plurality of capacitors each of which is provided on each of a plurality of phases;

a connection member that connects the plurality of capacitors of the plurality of phases in parallel; and a housing, wherein each of the positive-electrode heat release members is connected to a heat generation body via each of the plurality of positive-electrode terminals, each of the negative-electrode heat release members is connected to the heat generation body via each of the plurality of negative-electrode terminals, and the plurality of positive-electrode heat release members and the plurality of negative-electrode heat release members are provided along a wall surface of the housing.

* * * * *